United States Patent
Minnis

(10) Patent No.: US 6,392,493 B1
(45) Date of Patent: May 21, 2002

(54) FRACTIONAL-N FREQUENCY SYNTHESIZER

(75) Inventor: Brian J. Minnis, Crawley (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/633,763

(22) Filed: Aug. 7, 2000

(30) Foreign Application Priority Data

Aug. 10, 1999 (GB) .............................................. 9918732

(51) Int. Cl.$^7$ .............................................. H03L 7/197
(52) U.S. Cl. ........................ 331/1 A; 341/143; 708/313; 327/156; 327/159
(58) Field of Search .................... 331/16, 1 A; 341/143; 708/313; 327/156, 159

(56) References Cited

U.S. PATENT DOCUMENTS 6,008,703 A * 12/1999 Perrott et al. ............... 332/100

FOREIGN PATENT DOCUMENTS

WO    WO9914859    3/1999

* cited by examiner

*Primary Examiner*—Arnold Kinkead
(74) *Attorney, Agent, or Firm*—Theo Mak

(57) ABSTRACT

A fractional-N frequency synthesizer for use in a transmitter for transmitting TDMA signals, comprises a fourth order sigma-delta modulator(16) having an input for digitized signals, a FIR filter(18) having 2 taps coupled to an output of the sigma-delta modulator, the FIR filter (18) serving to increase the number of states on its output by one over the number of states on its input which is connected to an output of the sigma-delta modulator, and a phase locked loop(PLL) including a frequency divider(20) with an incremental ratio of 0.5 and having a control input coupled to an output of the FIR filter. The frequency divider (20) by having an incremental ratio of 0.5 enables the PLL to have a reference oscillator(24) operating at half the sampling frequency of the sigma-delta modulator(16). The frequency synthesizer as a consequence has been found to give a 12 dB improvement in noise level and also continuous tuning can be achieved because the successive groups of three half ratios adjacent tuning ranges made possible by using overlap.

12 Claims, 2 Drawing Sheets

FRACTIONAL-N FREQUENCY SYNTHESIZER

Figure 1:
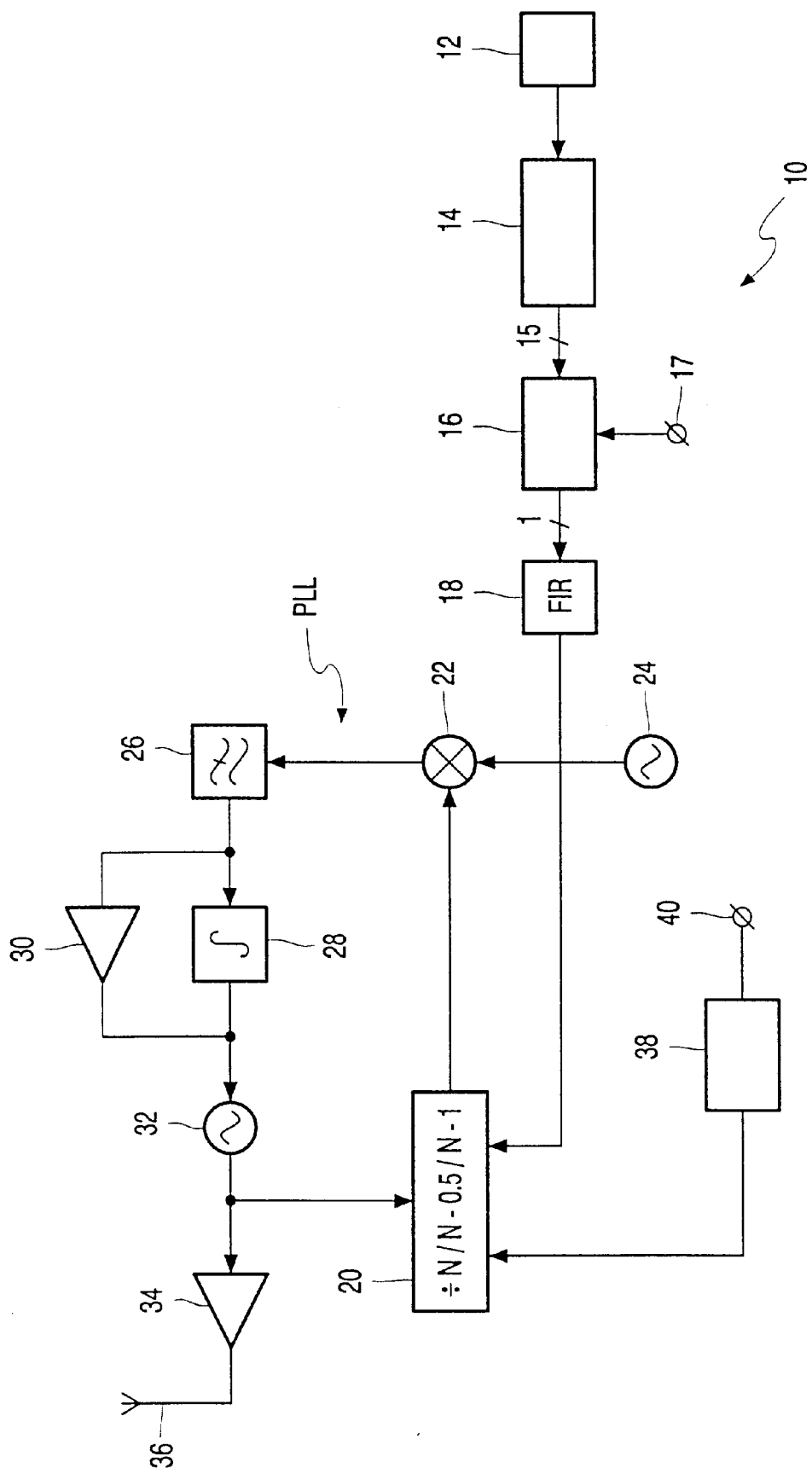

The present invention relates to a fractional-N frequency synthesiser and to a transmitter including the fractional-N frequency synthesiser and can be applied to cellular radio applications such as GSM. The transmitter may comprise the transmitting section of a transceiver. The present invention also relates to an integrated circuit comprising the integratable components of the fractional-N synthesiser.

PCT Specification WO99/14859 discloses a sigma-delta modulator controlled phase locked loop (PLL) for use in a frequency synthesiser and/or to generate a phase modulated signal. This citation discloses a PLL comprising a frequency divider having a control input for a signal determining the division factor in the frequency divider. A sigma-delta modulator for generating a modulated signal has an output coupled to a digital filter for filtering the modulated signal and generating a filtered signal which is applied to the control input of the frequency divider. By filtering the output of the sigma-delta modulator, the quantization noise in the output signal produced by the sigma-delta modulator can be reduced within certain frequency regions. The reduction in quantization noise can, in turn, be traded for a reduced oversampling rate and/or decreased phase noise.

In implementing the cited PLL the coefficients of the digital filter are chosen such that its output is integer valued as long as its input is integered valued. This is said to be an important feature because the frequency divider can only deal with integer valued division factors.

In order for the digital filter to be able to carry out the operations described it is assumed that it is implemented as a Finite Impulse Response (FIR) filter having a large number of stages which are necessary to introduce zeros to reduce noise. However by having such a large number of stages there is an equally large number of division ratios in the divider of the PLL which, in turn, translates into a large frequency gain. This degrades the signal to noise (S/N) ratio at the output of the PLL as well as causing an increase in power consumption. The poor S/N ratio will be explained in the context of GSM which requires the frequency deviation to be ±67.7 kHz. The input to the sigma-delta modulator is a succession of positive, and negative voltages corresponding to Non Return to Zero (NRZ) bits. If the frequency gain of the PLL is large, then the input signal to the sigma-delta modulator has to be attenuated by the reciprocal of the gain. Since the output noise from the sigma-delta modulator is constant, this reduces the S/N ratio at the output of the PLL. The primary task of the digital filter is to reduce the noise by filtering but this effect is offset by the increase in PLL frequency gain caused by its very presence.

An object of the present invention is to provide a low noise fractional-N frequency synthesiser having a continuous tuning range which is greater than obtained with known PLLs.

According to a first aspect of the present invention there is provided a frequency synthesiser comprising a signal input, a sigma-delta modulator coupled to the signal input, a digital filter means coupled to an output of the sigma-delta modulator, and a phase locked loop(PLL) including a frequency divider having a control input coupled to an output of the digital filter means, characterised in that the frequency divider comprises a fractional divider and in that the filter means is configured to increase the number of output states by one over the number of input states.

According to a second aspect of the present invention there is provided a transmitter comprising digitising means for generating digitised signal input samples, a sigma-delta modulator coupled to a signal output of said digitising means, a digital filter means coupled to an output of the sigma-delta modulator, and a phase locked loop(PLL) including a frequency divider having a control input coupled to an output of the digital filter means, the PLL having an output for a signal at a frequency determined by the PLL, characterised in that the frequency divider comprises a fractional divider and in that the filter means is configured to increase the number of output states by one over the number of input states.

According to a third aspect of the present invention there is provided an integrated circuit comprising the frequency synthesiser in accordance with the first aspect of the present invention.

Compared to the arrangement disclosed in WO99/14859, the digital filter is a relatively basic FIR filter having say 2 stages which serves to increase the number of output states to 3 for an input having 2 possible states without disturbing the highly desirable spectral shape of the quantisation noise close to zero frequency. The filter in these circumstances produces no increase in the frequency gain of the PLL and consequently has an insignificant effect on the S/N ratio from the PLL. More significantly, the frequency synthesiser is able to operate on half ratios which have been found to give a 12 dB improvement in noise level and also continuous tuning can be achieved because successive groups of 3 half ratios can overlap.

The half radios allow the divider output phase to move through an integer multiple of $\pi$ radians before the ratio is changed rather than the $2\pi$ radians as applied in the cited prior art. Hence in an embodiment of the present invention, the reference frequency of the PLL is half the clock frequency of the sigma-delta modulator. By halving the reference frequency it has been found that a 6 dB improvement in noise performance is obtained. Since another 6 dB improved is obtained from the step interval between the divider ratios, there is gained a 12 dB improvement in noise level compared to a situation where an adjacent pair of divider ratios is addressed directly by a 1-bit sigma-delta modulator.

Figure 2:
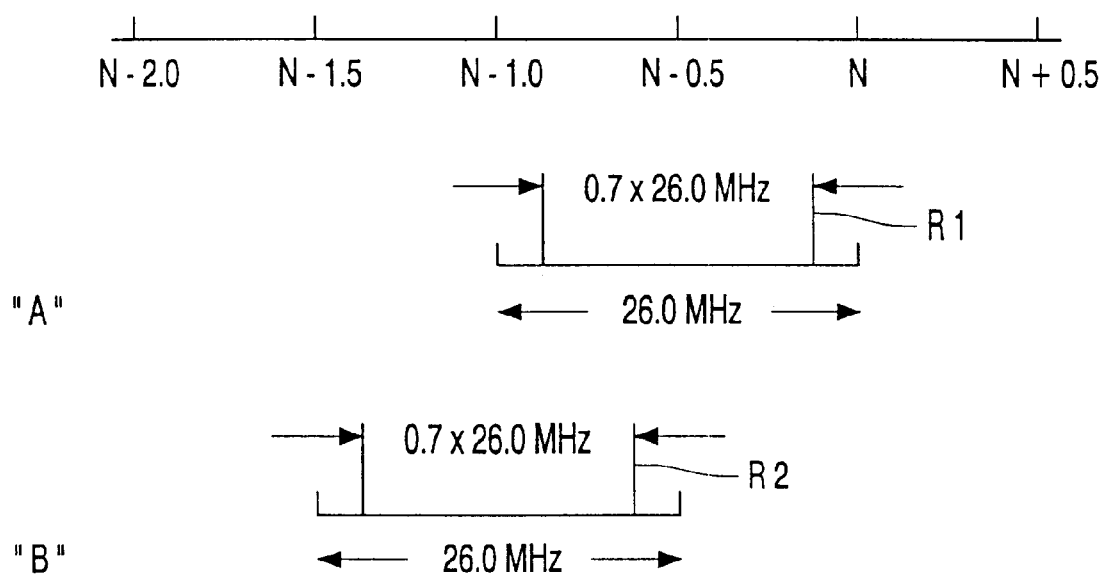

The present invention will now be described, by way of example, with reference to the accompanying drawings, wherein;

FIG. 1 is a block schematic diagram of an embodiment of a fractional-N transmitter suitable for use with a GSM cellular telephone, and FIG. 2 is a tuning diagram illustrating the tuning range of the transmitter shown in FIG. 1.

Referring to FIG. 1, the transmitter 10 comprises a data source 12 which in the case of GSM comprises data symbols at a data rate of 270.8333 kB/s. Each symbol is represented by a single binary bit which is then scaled and shifted to produce a bipolar stream of signal samples in which logical 1 and 0 are respectively assigned to numeric values +1 and −1. The data source is coupled to a Gaussian filter 14 which has a BT factor (bandwidth X bit period) BT=0.3 and a sampling rate of 2.1667 mega symbols/second (MS/s). After some amplitude scaling, the output of the filter 14 is a multi-bit, parallel representation equal to the instantaneous frequency deviation of the carrier due to the modulation and as such has dimensions of Hertz.

A 4th order sigma-delta modulator 16 sampled at 52 MS/s is coupled to the output of the filter 14. The modulator 16 is a purely digital element whose effect on its input signal is to apply quantisation with a resolution of n bits. In the present example n=1 and the output of the modulator 16 is a binary stream of samples with values ±1. The samples emerge at a rate equal to a predetermined clock frequency of 52 MHz. in this example and their average calculated over an appropriate period of time is a close approximation to the value of the input signal. A DC fine tuning demand signal is applied to an input 17.

A FIR filter 18 having 2 taps is coupled to an output of the sigma-delta modulator 16 to increase the number of output states from the modulator 16 by one additional output state, that is to 3 states +1, 0, −1 without disturbing the highly desirable spectral shape of the quantisation noise close to zero frequency. The three discrete output states map onto three discrete divider ratios, for example 35.0, 34.5 and 34.0, of a fractional divider 20 of a phase locked loop (PLL). The total number of divider ratios of which these three are a subset, is determined primarily by the tuning range requirement.

The PLL further comprises a phase comparator 22 consisting of a multiplier having a first input coupled to a 26 MHz stable reference oscillator 24 and a second input coupled to an output of the divider 20. The output from the phase comparator 22 is filtered in a low pass filter 26 having a passband below 400 kHz. An integrator 28 and an amplifier 30 shunting the integrator 28 form a narrowband PLL is coupled between an output of the low pass filter 26 and a transmitter voltage controlled oscillator (TxVCO) 32. The output of the TxVCO 32 is coupled to the input of the divider 20 and to a power amplifier 34. An antenna 36 or other signal propagation means or signal storage means (not shown) is coupled to an output of the power amplifier 34. As the basic operation of the PLL frequency synthesiser is well known, it will not be described.

A consequence of using divider ratios which have an incremental step of 0.5 is that the divider 20 is able to switch ratio after its output has moved through an integer multiple of only $\pi$ radians rather than $2\pi$ which applies when using integer dividers. Hence, requests for a particular ratio made by a demand signal on the input 17 to the sigma-delta modulator 16 can be acted upon twice in every cycle of the divider output and therefore twice in every cycle of the 26 MHz reference oscillator 24. This means that the reference frequency is able to be half of the frequency of the sigma-delta clock.

By halving the reference frequency to a value of 26 MHz produces a 6 dB improvement in noise performance and another 6 dB improvement comes from halving the step interval between the divider ratios making a total of 12 dB altogether.

FIG. 2 illustrates the tuning range which can be obtained by having three active divider ratios, each separated by 0.5. For a fractional divider the tuning range, $$f_{tune} = \frac{0.7 \times f_{clk} \cdot N_{taps}}{4}$$

where $N_{taps}$ is the number of taps in the FIR filter and the factor of 0.7 is imposed by the sigma-delta modulator 16.

Thus for $f_{clk}$=52 MHz and $N_{taps}$=1, $f_{tune}$=9.1 MHz. However when $N_{taps}$=2, $f_{tune}$=18.2 MHz. Thus by addressing a set of three divider ratios such as N, N−0.5 and N−1 with the 2 tap FIR filter 18 (diagram A), it is possible to have a tuning range R1 which covers a frequency band the lower end of which overlaps the higher end of an adjacent tuning range R2 band corresponding to the ratios N−0.5, N−1 and N−1.5 (diagram B). With this arrangement there are no gaps in the coverage and the tuning range is limited by only the available number of divider ratios and the tuning capability of the TxVCO 32.

Referring back to FIG. 1, the fine tuning range for divider ratios of 35.0, 34.5 and 34.0 is 18 MHz, that is 888 to 906 MHz. The resolution with which this tuning can be set depends on the word length, P, used at the input to the sigma-delta modulator 16. With a 15-bit word length, the frequency resolution $f_{res}$ will be:

$$f_{res} = \frac{2 \times f_{ref}}{(2^P - 1)} = \frac{2 \times 26000}{(2^{15} - 1)} = 1.587 \text{ kHz}$$

For coarse tuning a function block 38 is provided which in response to a coarse tuning demand on an input 40 calculates the base divider ratio N needed to place the TxVCO 32 in the most appropriate band encompassing the desired frequency. In the present implementation, a set of size consecutive divider ratios should offer a tuning range in excess of 45 MHz.

For convenience of description the present invention has been described with reference to the requirements of the GSM cellular telephone system but it is to be understood that the present invention may be applied to frequency synthesisers operating with other systems, especially TDMA systems.

The architecture illustrated in FIG. 1 is highly digitised making it attractive for integration in CMOS technology. It requires no ADCs or DACs, other than as required by the sigma-delta modulator, and no off-chip filters.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design manufacture and use of frequency synthesisers, transmitters including the frequency synthesisers and components therefor and which may be used instead of or in addition to features already described herein.

What is claimed is:

1. A frequency synthesizer comprising a signal input, a sigma-delta modulator coupled to the signal input, a digital filter means coupled to an output of the sigma-delta modulator, and a phase locked loop including a frequency divider having a control input coupled to an output of the digital filter means, the frequency divider comprising a fractional divider and the digital filter means being configured to increase a number of output states by one over a number of input states.

2. A frequency synthesizer as claimed in claim 1, wherein the number of output states is three.

3. A transmitter comprising digitizing means for generating digitized signal input samples, a sigma-delta modulator coupled to a signal output of said digitizing means, a digital filter means coupled to an output of the sigma-delta modulator, and a phase locked loop including a frequency divider having a control input coupled to an output of the digital filter means, the phase locked loop having an output for a signal at a frequency determined by the phase locked loop, the frequency divider comprising a fractional divider and the digital filter means being configured to increase a number of output states by one over a number of input states.

4. A transmitter as claimed in claim 3, wherein the number of output states is three.

5. An integrated circuit comprising a frequency synthesizer, the frequency synthesizer comprising a signal input, a sigma-delta modulator coupled to the signal input, a digital filter means coupled to an output of the sigma-delta modulator, and a phase locked loop including a frequency divider having a control input coupled to an output of the digital filter means, the frequency divider comprising a fractional divider and the digital filter means being configured to increase a number of output states by one over a number of input states.

6. A frequency synthesizer comprising:

a signal input;

a sigma-delta modulator coupled to the signal input, the sigma-delta modulator including a clock signal generator having a frequency f;

a digital filter means coupled to an output of the sigma-delta modulator, the digital filter means being configured to increase a number of output states by one over a number of input states; and a phase locked loop including a frequency divider having a control input coupled to an output of the digital filter means, the phase locked loop including a reference oscillator having a frequence of f/2, and the frequency divider comprising a fractional divider.

7. A transmitter comprising:

digitizing means for generating digitized signal input samples;

a sigma-delta modulator coupled to a signal output of the digitizing means, the sigma-delta modulator including a clock signal generator having a frequency f;

a digital filter means coupled to an output of the sigma-delta modulator, the digital filter means being configured to increase a number of output states by one over a number of input states; and a phase locked loop including a frequency divider having a control input coupled to an output of the digital filter means, the phase locked loop having an output for a signal at a frequency determined by the phase locked loop and including a reference oscillator having a frequence of f/2, and the frequency divider comprising a fractional divider.

8. A frequency synthesizer as claimed in claim 6, wherein the number of output states is three.

9. A transmitter as claimed in claim 7, wherein the number of output states is three.

10. An integrated circuit comprising a frequency synthesizer, the frequency synthesizer comprising:

a signal input;

a sigma-delta modulator coupled to the signal input, the sigma-delta modulator including a clock signal generator having a frequency f;

a digital filter means coupled to an output of the sigma-delta modulator, the digital filter means being configured to increase a number of output states by one over a number of input states; and a phase locked loop including a frequency divider having a control input coupled to an output of the digital filter means, the phase locked loop including a reference oscillator having a frequence of f/2, and the frequency divider comprising a fractional divider.

11. A frequency synthesizer as claimed in claim 6, wherein the sigma-delta modulator has a fine tuning input, and the digital filtering means is coupled to a coarse tuning input.

12. A transmitter as claimed in claim 7, wherein the sigma-delta modulator has a fine tuning input, and the digital filtering means is coupled to a coarse tuning input.

* * * * *